United States Patent
Michigami et al.

(10) Patent No.: US 11,218,130 B2
(45) Date of Patent: Jan. 4, 2022

(54) ACOUSTIC WAVE DEVICE

(71) Applicant: Murata Manufacturing Co., Ltd., Nagaokakyo (JP)

(72) Inventors: Akira Michigami, Nagaokakyo (JP); Yasumasa Taniguchi, Nagaokakyo (JP); Tsutomu Takai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 72 days.

(21) Appl. No.: 16/728,003

(22) Filed: Dec. 27, 2019

(65) Prior Publication Data

US 2020/0228087 A1    Jul. 16, 2020

(30) Foreign Application Priority Data

Jan. 16, 2019 (JP) .............................. JP2019-005023

(51) Int. Cl.
| | | |
|---|---|---|
| *H03H 9/02* | (2006.01) | |
| *H03H 9/13* | (2006.01) | |
| *H03H 9/145* | (2006.01) | |
| *H03H 9/10* | (2006.01) | |

(52) U.S. Cl.
CPC .... *H03H 9/02574* (2013.01); *H03H 9/02015* (2013.01); *H03H 9/02559* (2013.01); *H03H 9/02992* (2013.01); *H03H 9/1092* (2013.01); *H03H 9/131* (2013.01); *H03H 9/14502* (2013.01)

(58) Field of Classification Search
CPC ........... H03H 9/02015; H03H 9/14502; H03H 9/02992; H03H 9/02559; H03H 9/131; H03H 9/1092; H03H 9/059; H03H 9/175; H03H 9/02228; H03H 9/02897; H03H 9/02574
USPC .......................................... 333/133, 193–196
See application file for complete search history.

(56) References Cited

U.S. PATENT DOCUMENTS

| | | | |
|---|---|---|---|
| 5,635,883 A * | 6/1997 | Penunuri ............. | H03H 9/6436 310/313 D |
| 7,760,049 B2 * | 7/2010 | Uno ....................... | H03H 9/175 333/193 |
| 2016/0277003 A1 | 9/2016 | Kikuchi et al. | |

FOREIGN PATENT DOCUMENTS

WO    2015/098678 A1    7/2015

* cited by examiner

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An acoustic wave device includes a support substrate having a central region and a surrounding region located around the central region, a silicon oxide film that is located in the central region directly or indirectly and that has a side surface, a piezoelectric layer that is provided on the silicon oxide film and that has a first principal surface and a second principal surface, an excitation electrode provided on at least one of the first principal surface and the second principal surface, a cover film provided to cover the entire side surface of the silicon oxide film, a resin layer that is provided in the surrounding region and that is provided to cover the side surface of the silicon oxide film from above the cover film, and a wiring electrode that is electrically connected to the excitation electrode and that extends from the piezoelectric layer to the resin layer.

18 Claims, 5 Drawing Sheets

ACOUSTIC WAVE DEVICE

CROSS REFERENCE TO RELATED APPLICATIONS

This application claims the benefit of priority to Japanese Patent Application No. 2019-005023 filed on Jan. 16, 2019. The entire contents of this application are hereby incorporated herein by reference.

BACKGROUND OF THE INVENTION

1. Field of the Invention

The present invention relates to an acoustic wave device.

2. Description of the Related Art

Hitherto, acoustic wave devices have been widely used for filters of cellular phones and the like. International Publication No. 2015/098678 discloses an example of an acoustic wave device that includes a multilayer body in which a high acoustic velocity film, a low acoustic velocity film, and a piezoelectric film are stacked in this order in a region on a support substrate. The low acoustic velocity film is formed of silicon oxide. An interdigital transducer (IDT) is disposed on the piezoelectric film. An insulating layer formed of a resin is disposed around the multilayer body on the support substrate. The insulating layer extends to the side surface of the low acoustic velocity film. An electrode pad electrically connected to the interdigital transducer is disposed on the insulating layer. International Publication No. 2015/098678 discloses that stress during disposition of a metal bump is not readily applied to the piezoelectric film by disposing the metal bump on the electrode pad that is not located on the piezoelectric film.

However, in the acoustic wave device described in International Publication No. 2015/098678, moisture in air or moisture in the insulating layer formed of a resin may enter the low acoustic velocity film formed of silicon oxide. For example, when the acoustic wave device is mounted or sealed with a resin while the low acoustic velocity film includes moisture, the moisture is removed from the low acoustic velocity film by heat. At this time, stress is applied from the low acoustic velocity film to the piezoelectric film, and cracking or chipping may occur in the piezoelectric film or peeling of the piezoelectric film may occur.

SUMMARY OF THE INVENTION

Preferred embodiments of the present invention provide acoustic wave devices in each of which breakage or peeling of a piezoelectric layer is able to be significantly reduced or prevented.

An acoustic wave device according to a preferred embodiment of the present invention includes a support substrate including a central region and a surrounding region located around the central region in plan view, a silicon oxide film that is located in the central region directly or indirectly on the support substrate and that includes a side surface, a piezoelectric layer that is provided on the silicon oxide film and that includes a first principal surface and a second principal surface opposite to each other, an excitation electrode provided on at least one of the first principal surface and the second principal surface of the piezoelectric layer, a cover film that covers the entire or substantially the entire side surface of the silicon oxide film, a resin layer that is provided in the surrounding region on the support substrate and that covers the side surface of the silicon oxide film from above the cover film, and a wiring electrode that is electrically connected to the excitation electrode and that extends from the piezoelectric layer to the resin layer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by describing specific preferred embodiments according to the present invention with reference to the drawings.

It is to be noted that each of the preferred embodiments described in the present specification is an exemplification and that configurations shown in different preferred embodiments can be partly replaced or combined with each other.

Figure 1:
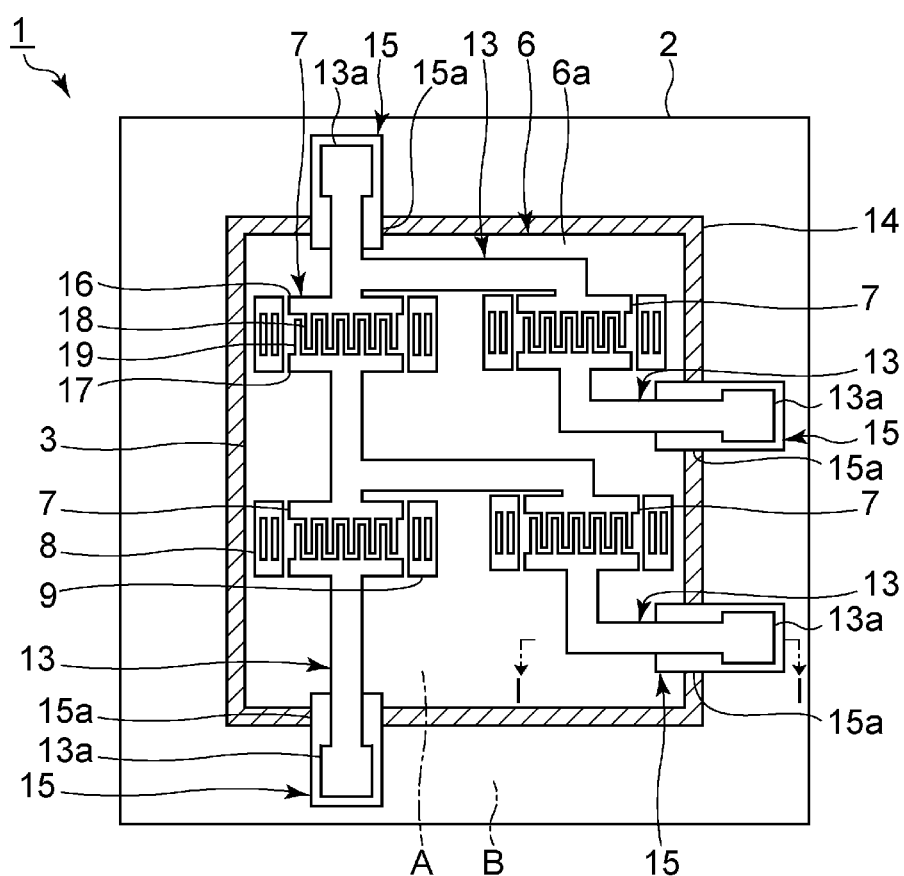
FIG. 1 is a plan view of an acoustic wave device according to a first preferred embodiment of the present invention.
Figure 2:
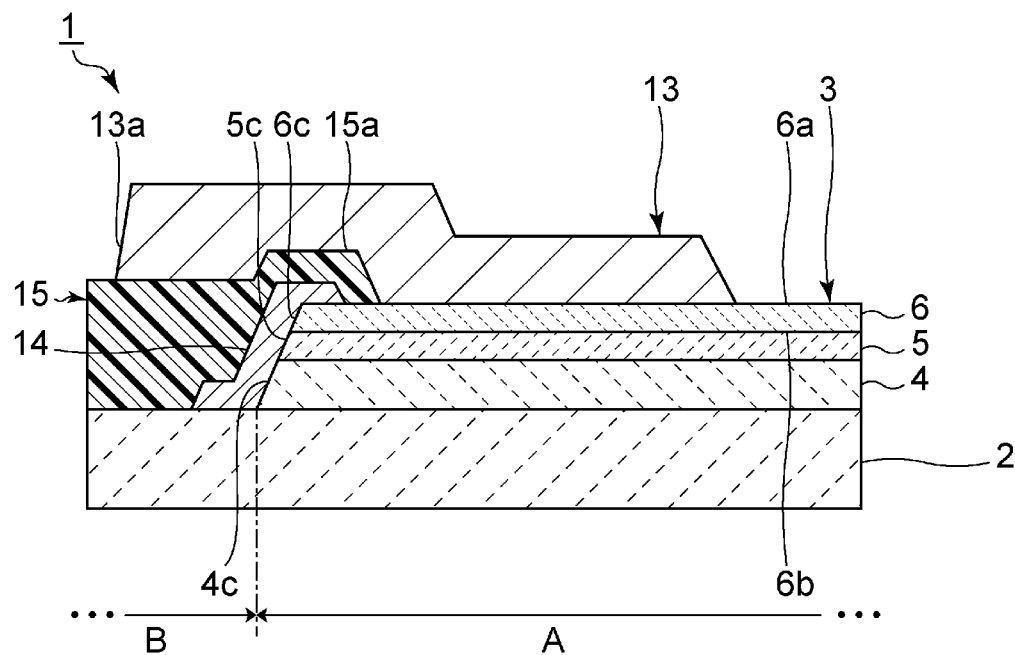
FIG. 2 is a sectional view of a section along line I-I in FIG. 1.

FIG. 1 is a plan view of an acoustic wave device according to a first preferred embodiment of the present invention. FIG. 2 is a sectional view of a section along line I-I in FIG. 1. In FIG. 1, a cover film described later is indicated by hatching.

As shown in FIG. 1, the acoustic wave device 1 includes a support substrate 2. The support substrate 2 includes a central region A and a surrounding region B located around the central region A in plan view. A multilayer film 3 is located in the central region A on the support substrate 2. As shown in FIG. 2, in the multilayer film 3, a high acoustic velocity film 4, a silicon oxide film 5, and a piezoelectric layer 6 are stacked in this order.

In FIG. 1, a plurality of interdigital transducers 7 are provided on the piezoelectric layer 6. Acoustic waves are excited by applying an alternating current voltage to the interdigital transducers 7. A reflector 8 and a reflector 9 are provided on respective sides of each interdigital transducer 7 in the acoustic wave propagation direction. Consequently, a plurality of acoustic wave resonators are provided. The acoustic wave device 1 according to the first preferred embodiment is preferably an acoustic wave filter device including a plurality of acoustic wave resonators. In this regard, the acoustic wave device according to preferred embodiments of the present invention is not limited to the acoustic wave filter device and may be, for example, an acoustic wave resonator including a single interdigital transducer 7.

As shown in FIG. 2, the piezoelectric layer 6 includes a first principal surface 6a and a second principal surface 6b opposite to each other. The plurality of interdigital transducers are provided on the first principal surface 6a. The second principal surface 6b is in contact with the silicon oxide film 5. In the present specification, "on the first principal surface 6a of the piezoelectric layer 6" may be simply described as "on the piezoelectric layer 6".

In the first preferred embodiment, the piezoelectric layer 6 is preferably a 50° Y-X lithium tantalate layer, for example. In this regard, the cut angle is not limited to the above, and the piezoelectric layer 6 may be, for example, a 42° Y-X lithium tantalate layer. The material of the piezoelectric layer 6 is not limited to lithium tantalate and may be, for example, lithium niobate.

The high acoustic velocity film 4 is a relatively high acoustic velocity film. More specifically, the acoustic velocity of a bulk wave that propagates through the high acoustic velocity film 4 is higher than the acoustic velocity of a bulk wave that propagates through the piezoelectric layer 6. In the first preferred embodiment, the high acoustic velocity film 4 is preferably, for example, a silicon nitride film. In this regard, the material of the high acoustic velocity film 4 is not limited to silicon nitride, and a medium including a material such as, for example, aluminum oxide, silicon carbide, silicon oxynitride, silicon, sapphire, lithium tantalate, lithium niobate, quartz, alumina, zirconia, cordierite, mullite, steatite, forsterite, magnesia, a diamond-like carbon (DLC) film or diamond, or the like as a primary component may be used.

In the first preferred embodiment, the silicon oxide film 5 is a low acoustic velocity film. The low acoustic velocity film is a relatively low acoustic velocity film. More specifically, the acoustic velocity of a bulk wave that propagates through the low acoustic velocity film is lower than the acoustic velocity of a bulk wave that propagates through the piezoelectric layer 6. Silicon oxide of the silicon oxide film 5 is represented by $SiO_x$, where x is an arbitrary positive number. In the first preferred embodiment, silicon oxide of the silicon oxide film 5 is preferably, for example, $SiO_2$.

The silicon oxide film 5 includes a side surface 5c that connects the principal surface near the support substrate 2 to the principal surface near the piezoelectric layer 6. Similarly, the high acoustic velocity film 4 includes a side surface 4c, and the piezoelectric layer 6 includes a side surface 6c. The side surface 4c, the side surface 5c, and the side surface 6c of the respective layers of the multilayer film 3 extend and are inclined with respect to the stacking direction of the multilayer film 3. However, each of the side surface 4c, the side surface 5c, and the side surface 6c may extend in the stacking direction.

In the first preferred embodiment, the thickness of the high acoustic velocity film 4 is preferably within the range of, for example, about 200 nm or more and about 900 nm or less. The thickness of the silicon oxide film 5 is preferably within the range of, for example, about 673 nm or more and about 735 nm or less. The thickness of the piezoelectric layer 6 is preferably, for example, about 600 nm. In this regard, the thickness of each layer in the multilayer 3 is not limited to the above.

Since the acoustic wave device 1 includes a multilayer structure in which the high acoustic velocity film 4, the silicon oxide film 5 defining and functioning as the low acoustic velocity film, and the piezoelectric layer 6 are stacked in this order, the energy of the acoustic wave is able to be substantially confined to the piezoelectric layer 6 side.

In the first preferred embodiment, the support substrate 2 is preferably, for example, a silicon support substrate. In this regard, the material of the support substrate 2 is not limited to silicon, and piezoelectric bodies, for example, aluminum oxide, lithium tantalate, lithium niobate, and quartz, various types of ceramic, for example, alumina, magnesia, silicon nitride, aluminum nitride, silicon carbide, zirconia, cordierite, mullite, steatite, and forsterite, dielectrics, for example, sapphire, diamond, and glass, semiconductors or resins, for example, gallium nitride, and the like may be used.

As shown in FIG. 1, the interdigital transducer 7 includes a first busbar 16 and a second busbar 17 that are opposite each other. The interdigital transducer 7 also includes a plurality of first electrode fingers 18, one end of each first electrode finger 18 being connected to the first busbar 16. In addition, the interdigital transducer 7 includes a plurality of second electrode fingers 19, one end of each second electrode finger 19 being connected to the second busbar 17. The plurality of first electrode fingers 18 and the plurality of second electrode fingers 19 interdigitate with each other.

Each of the interdigital transducer 7, the reflector 8, and the reflector 9 may include a multilayer metal film in which a plurality of metal layers are stacked or may include a single layer metal film.

As shown in FIG. 2, a cover film 14 covers the side surface 4c of the high acoustic velocity film 4, the side surface 5c of the silicon oxide film 5, and the side surface 6c of the piezoelectric layer 6. More specifically, as shown in FIG. 1, the cover film 14 covers the entire or substantially the entire surfaces of the side surface 4c, the side surface 5c, and the side surface 6c of the respective layers in the multilayer film 3. The cover film 14 extends from the side surface 4c, the side surface 5c, and the side surface 6c of the respective layers in the multilayer film 3 to the surrounding region B of the support substrate 2 and to the first principal surface 6a of the piezoelectric layer 6. In this regard, the cover film 14 only needs to cover the entire or substantially the entire side surface 5c of the silicon oxide film 5. In the first preferred embodiment, the cover film 14 is preferably, for example, a metal film. The cover film 14 is not limited to the above and may be a film including silicon, for example, an amorphous silicon film.

As shown in FIG. 1, a plurality of resin layers 15 are provided in the surrounding region B of the support substrate 2. Each resin layer 15 partly covers each of the side surface 4c, the side surface 5c, and the side surface 6c of the respective layers in the multilayer film 3. As shown in FIG. 2, the resin layer 15 covers the side surface 4c of the high acoustic velocity film 4, the side surface 5c of the silicon oxide film 5, and the side surface 6c of the piezoelectric layer 6 from above the cover film 14. The resin layer 15 is not in contact with the silicon oxide film 5. The resin layer 15 extends to the first principal surface 6a of the piezoelectric layer 6. The resin layer 15 includes a resin cover portion 15a that covers a portion of the cover film 14 extending to the piezoelectric layer 6.

As shown in FIG. 1, wiring electrodes 13 electrically connected to the respective interdigital transducers 7 are provided on the first principal surface 6a of the piezoelectric layer 6. Each wiring electrode 13 extends from the piezoelectric layer 6 to the resin layer 15. The wiring electrode 13 includes a terminal portion 13a located on the resin layer 15. More specifically, the terminal portion 13a is located in the surrounding region B of the support substrate 2 in plan view. Each external connection portion that is electrically connected to the outside, for example, to a bump, is bonded to the terminal portion 13a. In this regard, the acoustic wave device 1 includes a plurality of wiring electrodes 13, and the external connection portions are bonded to the respective terminal portions 13a of the wiring electrodes 13. The interdigital transducers 7 are electrically connected to the outside through the respective wiring electrodes 13 and external connection portions.

In, the first preferred embodiment, the cover film 14 is provided on the entire or substantially the entire side surface 5c of the silicon oxide film 5. As a result, moisture in air and moisture in the resin layer 15 are significantly reduced or prevented from entering the silicon oxide film 5. Since moisture is significantly reduced or prevented from entering the silicon oxide film 5, the moisture content in the silicon oxide film 5 is not readily changed. Consequently, even when heat is applied to the acoustic wave device 1 during, for example, mounting of the acoustic wave device 1, there is substantially no surplus moisture in the silicon oxide film 5 to be readily reduced. As a result, application of stress to the piezoelectric layer 6 resulting from a change in moisture content in the silicon oxide film 5 does not readily occur. Therefore, breakage and peeling of the piezoelectric layer 6 are able to be significantly reduced or prevented.

The cover film 14 preferably extends to the surrounding region B of the support substrate 2 and the piezoelectric layer 6, as in the first preferred embodiment, for example. The main heat source of the acoustic wave device 1 is the interdigital transducers 7. The above-described arrangement of the cover film 14 enables heat to be dissipated from the piezoelectric layer 6, on which the interdigital transducers 7 are provided, to the support substrate 2 through the cover film 14. As a result, the acoustic wave device 1 is not highly susceptible to damage.

The wiring electrode 13 extends from the central region A of the support substrate 2 to the surrounding region B. In the case in which the cover film 14 extends to the piezoelectric layer 6, the resin layer 15 preferably includes the above-described resin cover portion 15a shown in FIG. 2, for example. In addition, the wiring electrode 13 preferably extends from the central region A to the surrounding region B via the resin cover portion 15a and the wiring electrode 13 is preferably not in contact with the cover film 14, for example. Consequently, IR characteristics of the acoustic wave device 1 are able to be significantly reduced or prevented from degrading, and the heat dissipation function is able to be improved as described above.

The cover film 14 is not limited to extending to the piezoelectric layer 6. This example will be shown in a first modified example below.

Figure 3:
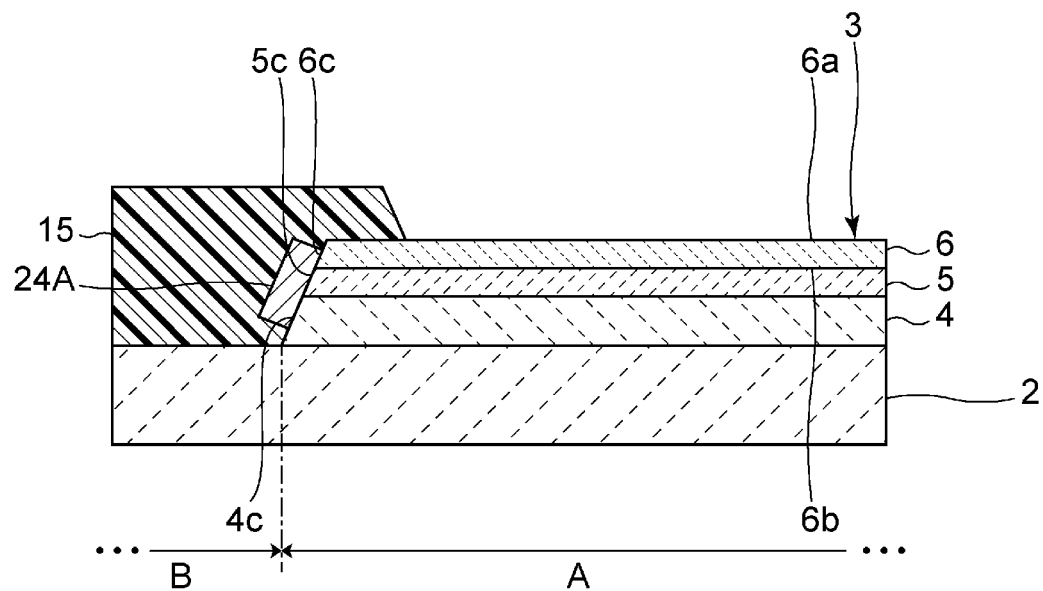
FIG. 3 is a sectional view showing a resin layer and a cover film and their vicinities in an acoustic wave device according to a first modified example of the first preferred embodiment of the present invention.

FIG. 3 is a sectional view showing a resin layer and a cover film and their vicinities in an acoustic wave device according to the first modified example of the first preferred embodiment. In this regard, FIG. 3 shows a cross section that does not include a wiring electrode.

In the first modified example of the first preferred embodiment, a cover film 24A covers the side surface 5c of the silicon oxide film 5 and extends to the side surface 4c of the high acoustic velocity film 4 and the side surface 6c of the piezoelectric layer 6. The cover film 24A does not extend to the first principal surface 6a of the piezoelectric layer 6.

The resin layer 15 is not limited to extending to the piezoelectric layer 6. However, the resin layer 15 preferably extends to the piezoelectric layer 6 as in the first preferred embodiment shown in FIG. 2. In this case, the wiring electrode 13 extends from the first principal surface 6a of the piezoelectric layer 6 to the resin layer 15 without extending via the side surface 6c. As a result, a height difference provided on the wiring electrode 13 can be reduced, and wire breakage in the wiring electrode 13 does not readily occur. In addition, since the resin layer 15 covers the side surface 4c, the side surface 5c, and the side surface 6c of the respective layers in the multilayer film 3 and extends to the piezoelectric layer 6, peeling of the piezoelectric layer 6 does not readily occur.

In the first preferred embodiment, a plurality of resin layers 15 is provided. However, a resin layer in a shape of a frame may cover the side surface 5c of the silicon oxide film 5 from above the cover film 14.

Figure 4:
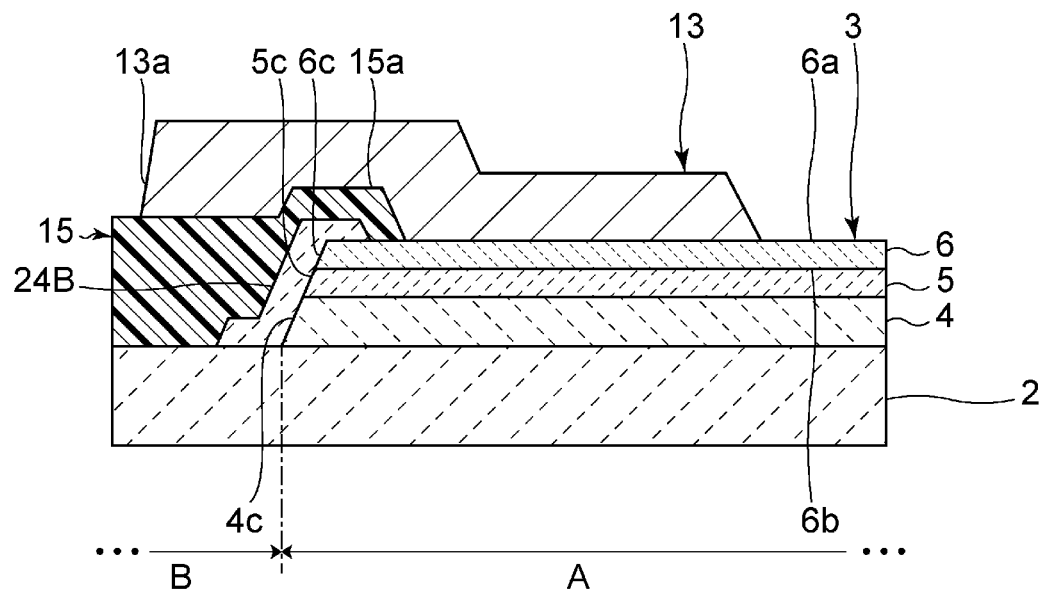
FIG. 4 is a sectional view showing a resin layer and a cover film and their vicinities in an acoustic wave device according to a second modified example of the first preferred embodiment of the present invention.

FIG. 4 is a sectional view showing a resin layer and a cover film and their vicinities in an acoustic wave device according to a second modified example of the first preferred embodiment.

The second modified example is different from the first preferred embodiment in that a cover film 24B is preferably a film including silicon, for example. In the present modified example, the entire or substantially the entire side surface 5c of the silicon oxide film 5 is covered with the cover film 24B. Consequently, moisture in air and moisture in the resin layer 15 is able to be significantly reduced or prevented from entering the silicon oxide film 5. Therefore, breakage and peeling of the piezoelectric layer 6 are able to be significantly reduced or prevented, as in the first preferred embodiment.

As shown in FIG. 2, in the multilayer film 3 of the acoustic wave device 1, the high acoustic velocity film 4, the silicon oxide film 5, and the piezoelectric layer 6 are stacked in this order. The silicon oxide film 5 is provided indirectly on the support substrate 2 with the high acoustic velocity film 4 provided therebetween. In this regard, the structure of the multilayer film is not limited to the above. A third modified example of the first preferred embodiment that is different from the first preferred embodiment only in the configuration of the multilayer film will be described below.

Figure 5:
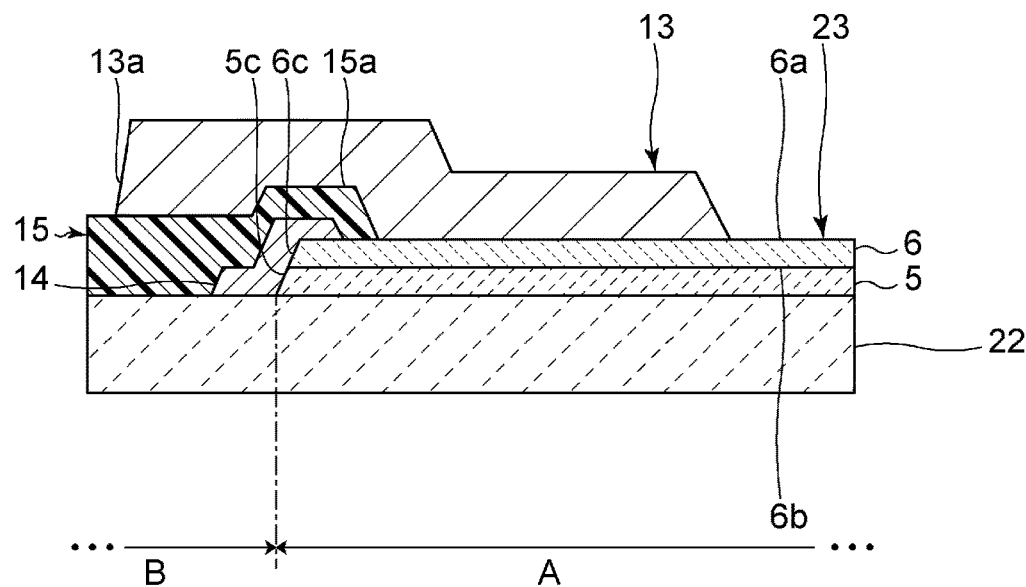
FIG. 5 is a sectional view showing a resin layer and a cover film and their vicinities in an acoustic wave device according to a third modified example of the first preferred embodiment of the present invention.

In the third modified example shown in FIG. 5, a multilayer film 23 includes the silicon oxide film 5 and the piezoelectric layer 6 stacked on the silicon oxide film 5 and does not include the high acoustic velocity film 4. The support substrate of the present modified example is a high acoustic velocity support substrate 22 that is a relatively high acoustic velocity substrate. More specifically, the acoustic velocity of a bulk wave that propagates through a high acoustic velocity support substrate 22 is higher than the acoustic velocity of a bulk wave that propagates through the piezoelectric layer 6. The silicon oxide film 5 is provided directly on the high acoustic velocity support substrate 22.

Regarding the material of the high acoustic velocity support substrate 22, a medium including a material such as, for example, aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, a DLC film or diamond, or the like as a primary component may be used.

In the present modified example, since a multilayer structure in which the high acoustic velocity support substrate 22, the silicon oxide film 5 defining and functioning as the low acoustic velocity film, and the piezoelectric layer 6 are stacked in this order is included, the energy of the acoustic wave can be confined to the piezoelectric layer 6 side, as in the first preferred embodiment.

Further, since the entire or substantially the entire side surface 5c of the silicon oxide film 5 is covered with the cover film 14 as in the first preferred embodiment, breakage and peeling of the piezoelectric layer 6 are able to be significantly reduced or prevented.

Figure 6:
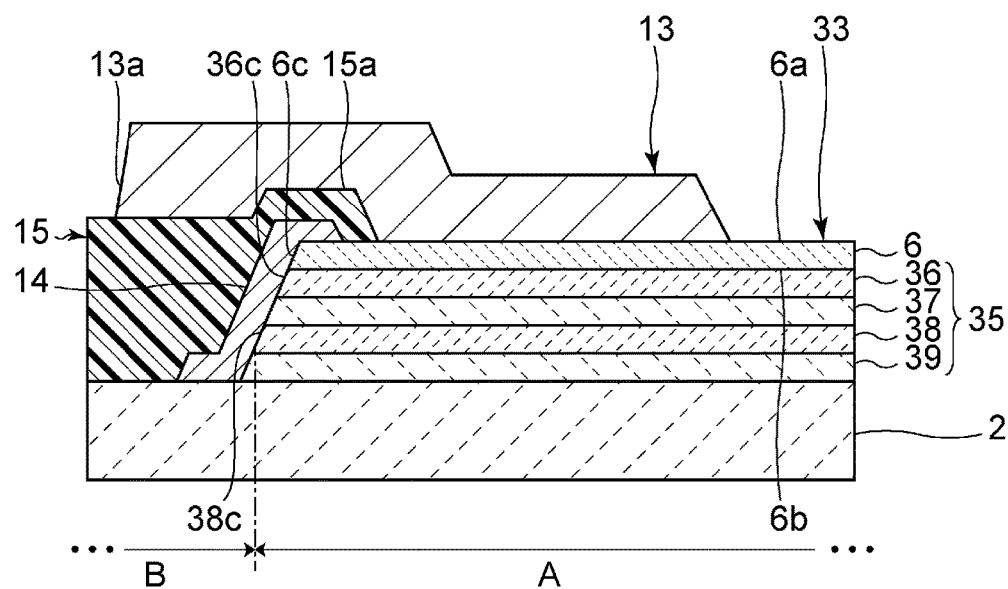
FIG. 6 is a sectional view showing a resin layer and a cover film and their vicinities in an acoustic wave device according to a second preferred embodiment of the present invention.

FIG. 6 is a sectional view showing a resin layer and a cover film and their vicinities in an acoustic wave device according to a second preferred embodiment of the present invention. FIG. 6 shows a portion corresponding to the cross section along line I-I in FIG. 1.

The second preferred embodiment is different from the first preferred embodiment in that a multilayer film 33 includes an acoustic reflection film 35 provided between the piezoelectric layer 6 and the support substrate 2. The acoustic reflection film 35 preferably includes, for example, a silicon oxide film.

The acoustic reflection film 35 includes a low acoustic impedance layer 36 and a low acoustic impedance layer 38 each having relatively low acoustic impedance and a high acoustic impedance layer 37 and a high acoustic impedance layer 39 each having relatively high acoustic impedance. In the second preferred embodiment, the low acoustic impedance layer 36 and the low acoustic impedance layer 38 are preferably silicon oxide films, for example. In the acoustic reflection film 35, the low acoustic impedance layers and the high acoustic impedance layers are alternately stacked. In this regard, the low acoustic impedance layer 36 is the layer located nearest to the piezoelectric layer 6 in the acoustic reflection film 35.

The acoustic reflection film 35 includes two low acoustic impedance layers and two high acoustic impedance layers. However, the acoustic reflection film 35 preferably includes at least one low acoustic impedance layer and at least one high acoustic impedance layer. At least one layer of the low acoustic impedance layer is preferably a silicon oxide film, for example. As shown in FIG. 6, the cover film 14 covers the entire or substantially the entire side surface of each layer in the acoustic reflection film 35.

As described above, in the second preferred embodiment, the entire or substantially the entire surface of each of the side surface 36c of the low acoustic impedance layer 36 defining and functioning as the silicon oxide film and the side surface 38c of the low acoustic impedance layer 38 is covered with the cover film 14. Consequently, moisture in air and moisture in the resin layer 15 is able to be significantly reduced or prevented from entering the silicon oxide film as in the first preferred embodiment. Therefore, breakage and peeling of the piezoelectric layer 6 are able to be significantly reduced or prevented.

In the second preferred embodiment, since the piezoelectric layer 6 is stacked on the acoustic reflection film 35, the energy of the acoustic wave is able to be substantially confined to the piezoelectric layer 6 side.

Figure 7:
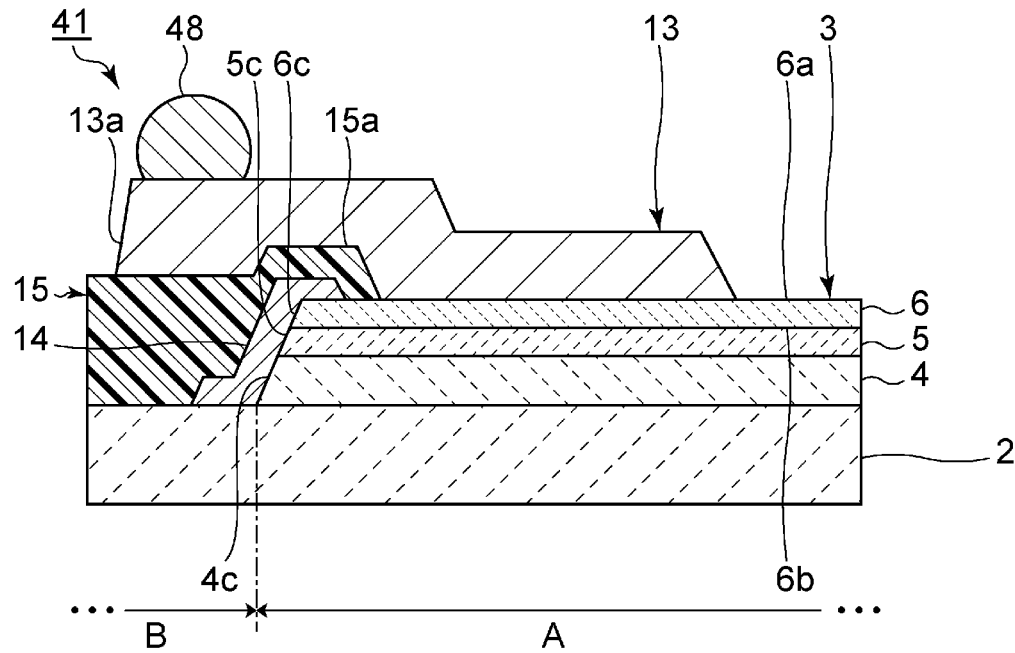
FIG. 7 is a sectional view showing a resin layer and a cover film and their vicinities in an acoustic wave device according to a third preferred embodiment of the present invention.

FIG. 7 is a sectional view showing a resin layer and a cover film and their vicinities in an acoustic wave device according to a third preferred embodiment of the present invention. FIG. 7 shows a portion corresponding to the cross section along line I-I in FIG. 1.

The third preferred embodiment is different from the first preferred embodiment in that a bump 48 defining and functioning as an external connection terminal is bonded to a terminal portion 13a of the wiring electrode 13. An acoustic wave device 41 of the third preferred embodiment has the same or substantially the same features as the acoustic wave device 1 of the first preferred embodiment except the above-described point.

When the acoustic wave device 41 is mounted, the acoustic wave device 41 is bonded to a mounting substrate or the like by the bump 48. The interdigital transducer elements 7 are electrically connected to the outside through the respective wiring electrodes 13 and bumps 48.

The bump 48 is located in the surrounding region B of the support substrate 2 in plan view. Consequently, stress is not readily applied to the piezoelectric layer 6 during bonding the bump 48 to the terminal portion 13a of the wiring electrode 13 and during mounting the acoustic wave device 41. Therefore, breakage and peeling of the piezoelectric layer 6 does not readily occur.

Further, in the third preferred embodiment, the entire or substantially the entire side surface 5c of the silicon oxide film 5 is covered with the cover film 14. Consequently, moisture in air and moisture in the resin layer 15 are able to be significantly reduced or prevented from entering the silicon oxide film 5. As a result, application of stress to the piezoelectric layer 6 resulting from a change in moisture content in the silicon oxide film 5 does not readily occur, as in the first preferred embodiment. Therefore, breakage and peeling of the piezoelectric layer 6 are able to be further significantly reduced or prevented.

Figure 8:
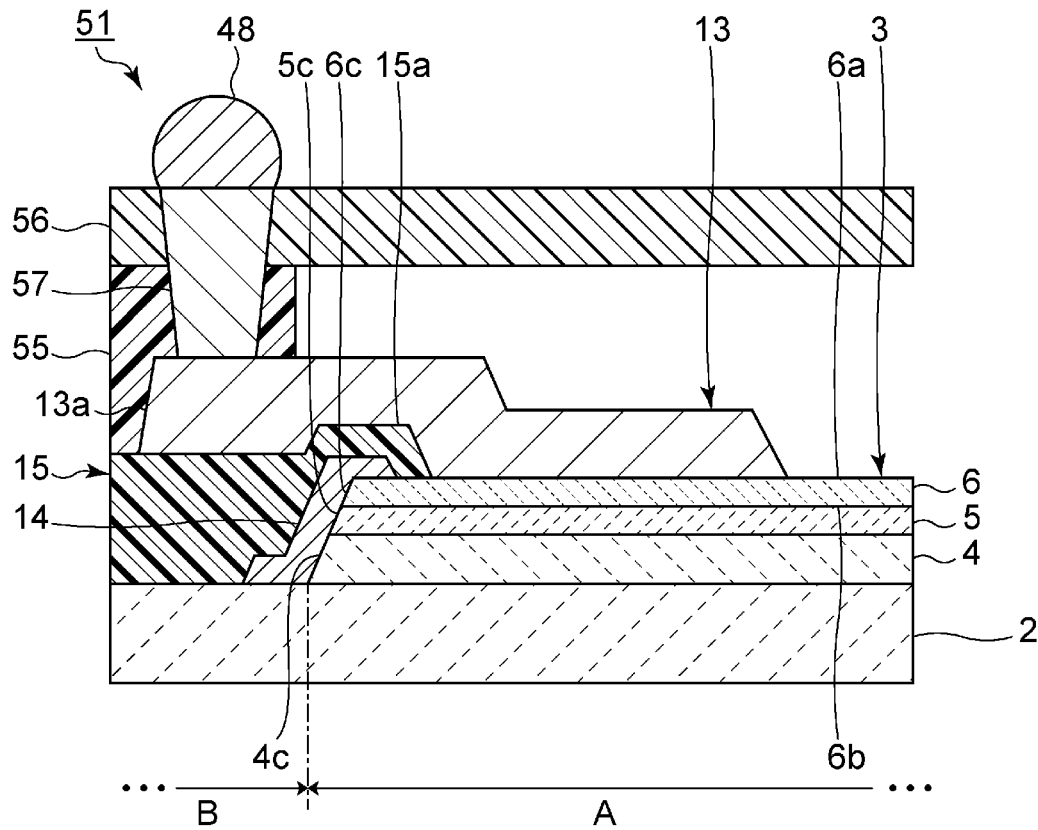
FIG. 8 is a sectional view showing a resin layer and a cover film and their vicinities in an acoustic wave device according to a fourth preferred embodiment of the present invention.

FIG. 8 is a sectional view showing a resin layer and a cover film and their vicinities in an acoustic wave device according to a fourth preferred embodiment of the present invention. FIG. 8 shows a portion corresponding to the cross section along line I-I in FIG. 1.

An acoustic wave device 51 of the fourth preferred embodiment is different from the acoustic wave device 1 of the first preferred embodiment in that a wafer level package (WLP) structure is provided. The acoustic wave device 51 of the fourth preferred embodiment has the same or substantially the same features as the acoustic wave device 1 of the first preferred embodiment except for the above-described point.

In the surrounding region B of the support substrate 2, a support member 55 including a cavity surrounds the multilayer film 3. In the cross section shown in FIG. 8, the support member 55 is provided indirectly on the support substrate 2 with the resin layer 15 provided therebetween. Meanwhile, the support member 55 includes a portion that is provided directly on the support substrate 2 and that has a cross section other than the cross section shown in FIG. 8. In this regard, the resin layer 15 may be substantially in the shape of a frame, and the entire or substantially the entire portion of the support member 55 may be provided indirectly on the support substrate 2 with the resin layer provided therebetween. The support member 55 covers the terminal portion 13a of the wiring electrode 13. The support member 55 is made of an appropriate resin.

A cover member 56 is provided on the support member 55 and covers the cavity of the support member 55. A plurality of via electrodes 57 penetrate the support member 55 and the cover member 56. One end portion of each of the plurality of via electrodes 57 is bonded to the corresponding terminal portion 13a. The other end portion of each of the plurality of via electrodes 57 is bonded to the corresponding bump 48. In the fourth preferred embodiment, the external connection portion includes the via electrode 57 and the bump 48.

In the fourth preferred embodiment, the bump 48 is located in the surrounding region B of the support substrate 2 in plan view. Further, the entire or substantially the entire side surface 5c of the silicon oxide film 5 is covered with the cover film 14. Consequently, moisture in the resin layer 15 is able to be significantly reduced or prevented from entering the silicon oxide film 5. As a result, application of stress to the piezoelectric layer 6 resulting from a change in moisture content in the silicon oxide film 5 does not readily occur, as in the first preferred embodiment. Therefore, breakage and peeling of the piezoelectric layer 6 are able to be significantly reduced or prevented.

In the above description, an example of the acoustic wave device shown in each of the first to fourth preferred embodiments and the modified examples is a surface acoustic wave (SAW) element in which the excitation electrode is the interdigital transducer. The acoustic wave device according to preferred embodiments of the present invention may be a bulk acoustic wave (BAW) element. This example will be described below.

Figure 9:
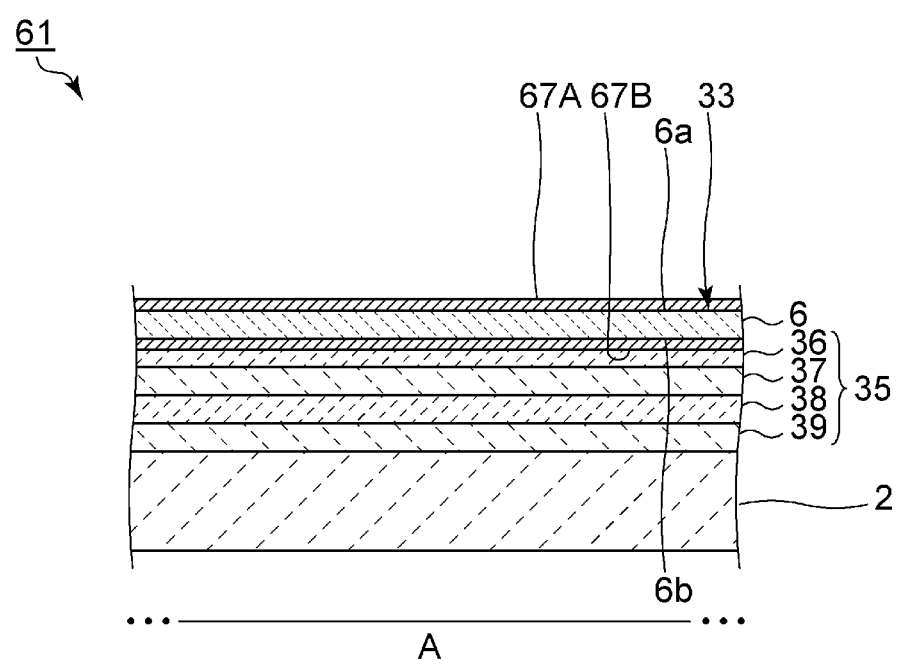
FIG. 9 is a sectional front view showing a portion located in the central region of a support substrate in an acoustic wave device according to a fifth preferred embodiment of the present invention.

FIG. 9 is a sectional front view showing a portion located in the central region of a support substrate in an acoustic wave device according to a fifth preferred embodiment of the present invention.

An acoustic wave device 61 of the fifth preferred embodiment is a solidly mounted resonator (SMR) type BAW element including a plurality of BAW resonators and the acoustic reflection film 35. The fifth preferred embodiment is different from the second preferred embodiment in the features of the excitation electrode and routing of the wiring line. The acoustic wave device 61 of the fifth preferred embodiment has the same or substantially the same features as the acoustic wave device of the second preferred embodiment except for the above-described points.

More specifically, the excitation electrode of the fifth preferred embodiment is each of a first flat-plate electrode 67A provided on the first principal surface 6a of the piezoelectric layer 6 and a second flat-plate electrode 67B provided on the second principal surface 6b. The first flat-plate electrode 67A and the second flat-plate electrode 67B are opposite each other and include respective portions superposed on each other in plan view. The first flat-plate electrode 67A is directly connected to the wiring electrode 13 that is the same or substantially the same as in the second preferred embodiment. On the other hand, the second flat-plate electrode 67B is not directly connected to the wiring electrode 13. The second flat-plate electrode 67B is not in contact with the cover film 14. In the fifth preferred embodiment, a wiring line is routed on the first principal surface 6a of the piezoelectric layer 6 and a wiring line is also routed on the second principal surface 6b to connect the BAW resonators to each other.

In the case in which the second flat-plate electrode 67B is in direct contact with the wiring electrode 13, the second flat-plate electrode 67B or the wiring electrode 13 is in contact with the cover film 14. Meanwhile, in the fifth preferred embodiment, the second flat-plate electrode 67B is provided inside the side surface 6c of the piezoelectric layer 6 and inside the side surface 36c of the low acoustic impedance layer 36 and is not in direct contact with the wiring electrode 13 in plan view. Consequently, neither the second flat-plate electrode 67B nor the wiring electrode 13 is in contact with the cover film 14. As described above, the wiring electrode 13 is in direct contact with the first flat-plate electrode 67A.

In the fifth preferred embodiment, as in the second preferred embodiment shown in FIG. 6, the entire or substantially the entire surfaces of the side surface 36c of the low acoustic impedance layer 36 defining and functioning as the silicon oxide film and the side surface 38c of the low acoustic impedance layer 38 are covered with the cover film 14. Consequently, moisture in air and moisture in the resin layer 15 are able to be significantly reduced or prevented from entering the silicon oxide film. Therefore, breakage and peeling of the piezoelectric layer 6 are able to be significantly reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
 a support substrate including a central region and a surrounding region located around the central region in plan view;
 a silicon oxide film located in the central region directly or indirectly on the support substrate and including a side surface;
 a piezoelectric layer provided on the silicon oxide film and including a first principal surface and a second principal surface opposite to each other;
 an excitation electrode provided on at least one of the first principal surface and the second principal surface of the piezoelectric layer;
 a cover film covering the entire or substantially the entire side surface of the silicon oxide film;
 a resin layer provided in the surrounding region on the support substrate and covering the side surface of the silicon oxide film from above the cover film; and
 a wiring electrode electrically connected to the excitation electrode and extending from the piezoelectric layer to the resin layer.

2. The acoustic wave device according to claim 1, wherein the cover film extends to the surrounding region of the support substrate and the piezoelectric layer.

3. The acoustic wave device according to claim 2, wherein the resin layer extends to the piezoelectric layer and includes a resin cover portion that covers the portion of the cover film extending to the piezoelectric layer.

4. The acoustic wave device according to claim 3, wherein the wiring electrode extends from the central region of the support substrate to the surrounding region via the resin cover portion.

5. The acoustic wave device according to claim 4, wherein the resin cover portion of the resin layer covers an entire or substantially an entire portion that extends to the piezoelectric layer of the cover film.

6. The acoustic wave device according to claim 1, wherein the cover film is a metal film.

7. The acoustic wave device according to claim 1, wherein the cover film is a film including silicon.

8. The acoustic wave device according to claim 1, wherein the excitation electrode is an interdigital transducer provided on the first principal surface of the piezoelectric layer.

9. The acoustic wave device according to claim 8, wherein a first reflector and a second reflector are provided on respective sides of the interdigital transducer in an acoustic wave propagation direction.

10. The acoustic wave device according to claim 8, wherein the interdigital transducer includes a first busbar and a second busbar that are opposite each other, the first busbar being connected to a plurality of first electrode fingers and the second busbar being connected to a plurality of second electrode fingers.

11. The acoustic wave device according to claim 1, wherein
an acoustic reflection film is provided between the piezoelectric layer and the support substrate;
the acoustic reflection film includes low acoustic impedance layers having relatively low acoustic impedance and high acoustic impedance layers having relatively high acoustic impedance;
the low acoustic impedance layers and the high acoustic impedance layers are alternately stacked; and
at least one layer of the low acoustic impedance layers is the silicon oxide film.

12. The acoustic wave device according to claim 1, further comprising an external connection portion bonded to a portion located on the resin layer of the wiring electrode and that is electrically connected to outside.

13. The acoustic wave device according to claim 1, wherein the support substrate is a silicon support substrate.

14. The acoustic wave device according to claim 1, wherein the excitation electrode is each of a first flat-plate electrode provided on the first principal surface of the piezoelectric layer and a second flat-plate electrode provided on the second principal surface.

15. The acoustic wave device according to claim 1, wherein
the silicon oxide film is a low acoustic velocity film;
a high acoustic velocity film is provided between the low acoustic velocity film and the support substrate;
the acoustic velocity of a bulk wave that propagates through the low acoustic velocity film is lower than the acoustic velocity of a bulk wave that propagates through the piezoelectric layer; and
the acoustic velocity of a bulk wave that propagates through the high acoustic velocity support substrate is higher than the acoustic velocity of a bulk wave that propagates through the piezoelectric layer.

16. The acoustic wave device according to claim 15, wherein
the high acoustic velocity film is a silicon nitride film; and
the low acoustic velocity film is a silicon oxide film.

17. The acoustic wave device according to claim 15, wherein
a thickness of the high acoustic velocity film is between about 200 nm and about 900 nm; and
a thickness of the low acoustic velocity film is between about 673 nm and about 735 nm.

18. The acoustic wave device according to claim 15, wherein the resin layer is not in contact with the low acoustic velocity film.

* * * * *